US012221684B2

(12) United States Patent
Bai

(10) Patent No.: US 12,221,684 B2
(45) Date of Patent: Feb. 11, 2025

(54) MASK PLATE AND MANUFACTURING METHOD THEREOF

(71) Applicant: BOE Technology Group Co., Ltd., Beijing (CN)

(72) Inventor: Shanshan Bai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 777 days.

(21) Appl. No.: 16/770,183

(22) PCT Filed: Nov. 12, 2019

(86) PCT No.: PCT/CN2019/117513
§ 371 (c)(1),
(2) Date: Apr. 22, 2021

(87) PCT Pub. No.: WO2020/098645
PCT Pub. Date: May 22, 2020

(65) Prior Publication Data
US 2021/0301386 A1 Sep. 30, 2021

(30) Foreign Application Priority Data

Nov. 12, 2018 (CN) .......................... 201811338402.7

(51) Int. Cl.
C23C 14/04 (2006.01)
C23C 14/24 (2006.01)
(52) U.S. Cl.
CPC ............ *C23C 14/042* (2013.01); *C23C 14/24* (2013.01)
(58) Field of Classification Search
USPC ................. 118/504, 505, 301, 721
See application file for complete search history.

(56) References Cited

U.S. PATENT DOCUMENTS

2014/0232109 A2\* 8/2014 Nguyen ................ F16L 37/138
285/314
2014/0331925 A1 11/2014 Han
(Continued)

FOREIGN PATENT DOCUMENTS

CN 103190005 A 7/2013
CN 103205687 A 7/2013
(Continued)

OTHER PUBLICATIONS

First Office Action with Search Report dated Dec. 4, 2019 corresponding to Chinese application No. 201811338402.7.
(Continued)

*Primary Examiner* — Yewebdar T Tadesse
(74) *Attorney, Agent, or Firm* — Nath, Goldberg & Meyer; Joshua B. Goldberg

(57) ABSTRACT

The disclosure provides a mask plate and a manufacturing method thereof. The mask plate includes at least one pattern region, each pattern region includes a first opening region and a second opening region which are adjacent to each other along a lengthwise direction of the mask plate, each of the first opening region and the second opening region has a plurality of pattern openings penetrating through the mask plate along a thickness direction of the mask plate, a ratio of a sum of areas of the pattern openings in the second opening region to a total area of the second opening region is greater than a ratio of a sum of areas of the pattern openings in the first opening region to a total area of the first opening region, the first opening region has grooves not penetrating through the mask plate.

13 Claims, 6 Drawing Sheets

(56) References Cited

U.S. PATENT DOCUMENTS

| | | | |
|---|---|---|---|
| 2015/0007768 A1 | 1/2015 | Lee | |
| 2016/0312354 A1 | 10/2016 | Ko et al. | |
| 2018/0040857 A1* | 2/2018 | Hong | C23C 14/541 |
| 2018/0065143 A1 | 3/2018 | Baek et al. | |
| 2018/0163290 A1 | 6/2018 | Xu et al. | |

FOREIGN PATENT DOCUMENTS

| | | |
|---|---|---|
| CN | 204434717 U | 7/2015 |
| CN | 105039905 A | 11/2015 |
| CN | 105803389 A | 7/2016 |
| CN | 106294935 A | 1/2017 |
| CN | 107740065 A | 2/2018 |
| CN | 107885030 A | 4/2018 |
| CN | 108269837 A | 7/2018 |
| CN | 108642440 A | 10/2018 |
| CN | 108666420 A | 10/2018 |
| CN | 208013662 U | 10/2018 |
| CN | 109207920 A | 1/2019 |
| EP | 3282035 A2 | 2/2018 |
| JP | 2004148563 A | 5/2004 |
| JP | 2009074160 A | 4/2009 |
| JP | 2014194062 A | 10/2014 |
| JP | 2018026344 A | 2/2018 |
| JP | 2020523478 A | 8/2020 |
| KR | 20150096590 A | 8/2015 |
| WO | 2018139822 A1 | 8/2018 |

OTHER PUBLICATIONS

Second Office Action with Search Report dated Apr. 22, 2020 corresponding to Chinese application No. 201811338402.7.

Third Office Action with Search Report dated Aug. 25, 2020 corresponding to Chinese application No. 201811338402.7.

The Extended European Search Report dated Jul. 11, 2022 corresponding to application No. 19884926.7-1103.

Notice of Reasons for Rejection dated Dec. 18, 2023 corresponding to Japanese application No. 2020-560749.

* cited by examiner

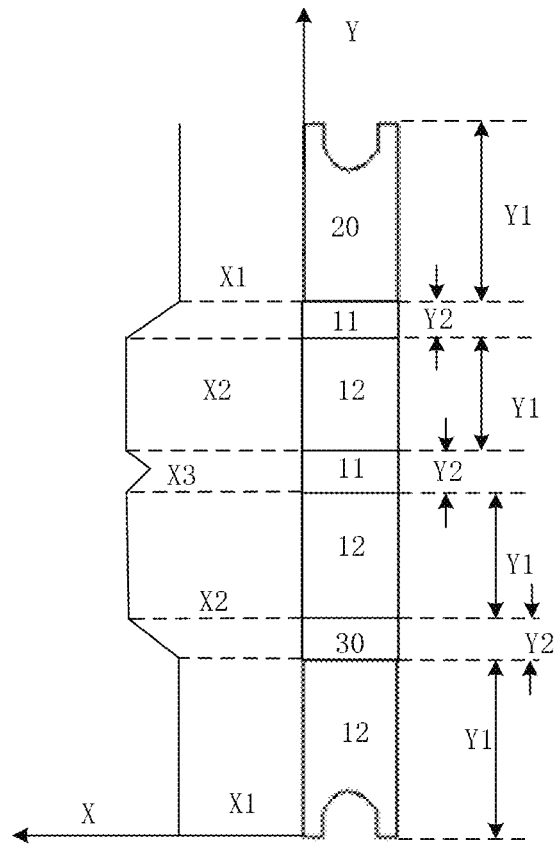

FIG. 5

| forming pattern openings on a mask substrate, a ratio of a sum of areas of pattern openings in a high-density opening region to a total area of the high-density opening region is greater than a ratio of a sum of areas of pattern openings in a low-density opening region to a total area of the low-density opening region |— 601|

| forming grooves which do not penetrate through the mask plate along a thickness direction of the mask plate at positions between the pattern openings of the low-density opening region |— 602|

FIG. 6

MASK PLATE AND MANUFACTURING METHOD THEREOF

CROSS-REFERENCE TO RELATED APPLICATIONS

This is a National Phase Application filed under 35 U.S.C. 371 as a national stage of PCT/CN2019/117513, filed Nov. 12, 2019, an application claiming the benefit of Chinese Application No. 201811338402.7, filed Nov. 12, 2018, the content of each of which is hereby incorporated by reference in its entirety.

TECHNICAL FIELD

The present disclosure relates to the field of display technology, and particularly relates to a mask plate and a manufacturing method thereof.

BACKGROUND

In an existing display device with a 'full-screen', taking a full-screen mobile phone as an example, a display area of the full-screen mobile phone is divided into two display regions, i.e., a first display region and a second display region, a ratio of areas of pixels in the first display region close to an end of the full-screen mobile phone to an total area of the first display region is relative small, the first display region has a low resolution and a sensor such as a camera or the like may be placed on a back of the first display region, the low resolution can ensure that an enough transparent region is reserved for the sensor; a ratio of areas of pixels in the second display region to a total area of the second display region is relative large, and the second display region has a high resolution.

SUMMARY

An embodiment of the present disclosure provides a mask plate, including at least one pattern region, each of the at least one pattern region includes a first opening region and a second opening region adjacent to each other in a lengthwise direction of mask plate, each of the first opening region and the second opening region has a plurality of pattern openings penetrating through the mask plate along a thickness direction of the mask plate, wherein, a ratio of a sum of areas of the pattern openings in the second opening region to a total area of the second opening region is greater than a ratio of a sum of areas of the pattern openings in the first opening region to a total area of the first opening region, and the first opening region further has grooves therein not penetrating through the mask plate in the thickness direction of the mask plate.

In some implementations, the area of each of the pattern openings in the first opening region is different from that of each of the pattern openings in the second opening region.

In some implementations, a shape and a dimension of each of the grooves are respectively the same as a shape and a dimension of each of the pattern openings in the first opening region.

In some implementations, a center of each of at least a portion of the grooves is located at a center of a pattern constituted by centers of multiple ones of the pattern openings adjacent to said each of the at least a portion of the grooves.

In some implementations, the pattern openings in the first opening region are arranged in rows and columns, and at least a portion of the grooves are located between adjacent rows of the pattern openings in the first opening region and between adjacent columns of the pattern openings in the first opening region.

In some implementations, the grooves are located on an upper surface and/or a lower surface of the mask plate.

In some implementations, except a boundary between the first opening region and the second opening region, an expansion-contraction ratio at any position of the first opening region in a first direction and a second direction of the mask plate are respectively different from an expansion-contraction ratio at any position of the second opening region in the first direction and the second direction of the mask plate, wherein the first direction is a direction in which the first opening region and the second opening region are arranged, and the second direction is a direction orthogonal to the first direction.

In some implementations, except the boundary between the first opening region and the second opening region, the expansion-contraction ratio at any position of the first opening region in the second direction of the mask plate are respectively less than the expansion-contraction ratio at any position of the second opening region in the second direction of the mask plate.

In some implementations, except the boundary between the first opening region and the second opening region, the expansion-contraction ratio at any position of the first opening region in the first direction of the mask plate is larger than the expansion-contraction ratio at any position of the second opening region in the first direction of the mask plate.

In some implementations, the mask plate further includes a dummy first opening region, and a first dummy end region and a second dummy end region located at both ends of the mask plate in the first direction, the dummy first opening region is located between the second dummy end region away from the first opening region and the second opening region proximal to the second dummy end region, and a shape of the dummy first opening region is the same as that of the first opening region.

In some implementations, each of expansion-contraction ratios of the dummy first opening region and the first opening region adjacent to the second dummy end region in the second direction of the mask plate is linearly changed in the first direction of the mask plate.

In some implementations, the mask plate has two pattern regions repeatedly arranged along the first direction of the mask plate, and except the first opening region adjacent to the second dummy end region, the expansion-contraction ratio of another first opening region in the second direction of the mask plate is linearly changed from a first position in the another first opening region to boundaries of two second opening regions adjacent thereto, respectively.

In some implementations, the mask plate has a plurality of the pattern regions repeatedly arranged in the first direction of the mask plate, the mask plate being symmetrically arranged with respect to a center line, in the second direction, of the first opening region at a central position of the mask plate, for the first opening region at the central position of the mask plate, in a direction from the center line to the first dummy end region, dimensions in the second direction at edge positions linearly increase, and in a direction from the center line to the second dummy end region, dimensions in the second direction at edge positions linearly increase;

in a direction from the first opening region at the central position to the first dummy end region, dimensions in the second direction at edge positions within each first opening region except the first opening region at the central position linearly decreases; and in a direction from the first opening region at the central position to the second dummy end region, dimensions in the second direction at edge positions within each first opening region except the first opening region at the central position linearly decreases.

In some implementations, in each second opening region, dimensions in the second direction at edge positions are the same;

in the direction from the first opening region at the central position to the first dummy end region, dimensions of the second opening regions in the second direction successively decrease;

in the direction from the first opening region at the central position to the second dummy end region, dimensions of the second opening regions in the second direction successively decrease.

An embodiment of the present disclosure provides a manufacturing method of a mask plate, including: forming pattern openings on a mask substrate, wherein a ratio of a sum of areas of the pattern openings in a second opening region to a total area of the second opening region is greater than a ratio of a sum of areas of the pattern openings in a first opening region to a total area of the first opening region; and forming a groove not penetrating through the mask plate along a thickness direction of the mask plate at a position between the pattern openings of the first opening region.

An embodiment of the present disclosure provides a method of using the mask plate, including:

attaching a first dummy end region to an end, which is away from the second opening region, of the first opening region at an end of the mask plate;

attaching a dummy first opening region to an end, which is away from the first opening region, of the second opening region at another end of the mask plate;

attaching a second dummy end region to an end of the dummy first opening region away from the second opening region;

stretching the mask plate by utilizing the first dummy end region and the second dummy end region, so that edges of the mask plate along a direction in which the mask plate is stretched are in a linear shape.

DESCRIPTION OF DRAWINGS

FIG. 2 (c) is a schematic diagram of shapes of openings for forming RGB pixel units in a mask plate according to an embodiment of the present disclosure;

FIG. 5 is a schematic diagram showing dimensions of a mask plate before being stretched according to an embodiment of the present disclosure;

FIG. 6 is a flowchart of a manufacturing method of a mask plate according to an embodiment of the present disclosure.

DESCRIPTION OF EMBODIMENTS

In order to make those skilled in the art better understand the technical solutions of the present disclosure, the following detailed description is given with reference to the accompanying drawings and the specific embodiments.

Figure 1:
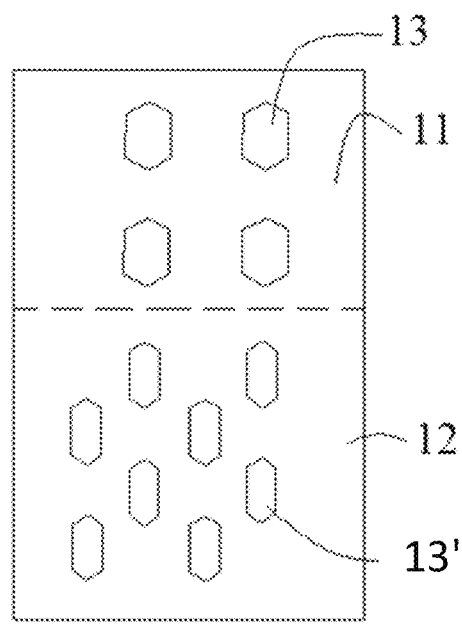
FIG. 1 is a diagram showing a distribution of pattern openings in a low-density opening region and a high-density opening region of a mask plate in the related art.

A type of mask plate that is commonly used when manufacturing a display substrate of a "full-screen" display device in the related art is, for example, a precision metal mask plate. A film formation process such as an evaporation process may be performed using such type of mask plate to form a pattern (e.g., an outline of organic light emitting layer in an organic light emitting diode) of a pixel on the display substrate. FIG. 1 shows shapes and a distribution of pattern openings 13 in such type of mask plate. Each of the pattern openings 13 penetrates through the whole mask plate so that a material to be evaporated can reach the display substrate by passing through these pattern openings 13. Specifically, the pattern openings 13 shown in FIG. 1 correspond to shapes of organic light emitting layers in red organic light emitting diodes. It will be readily understood that FIG. 1 shows one pattern region of the mask plate, which is used to form a pattern on one display substrate (also called as panel), in order to form two regions with different resolutions, two regions (a low-density opening region 11 and a high-density opening region 12) are present in each pattern region.

Since shapes and distributions of the pattern openings 13 are respectively different in the low-density opening region 11 and the high-density opening region 12, when the mask plate is spread and stretched, expansions and contractions of the mask plate are respectively inconsistent in the two regions, which easily causes that positions and shapes of the pattern openings 13 after the mask plate is stretched are not expected positions and shapes, and it is difficult to accurately control the pattern openings 13 after the mask plate is stretched.

Figure 2:
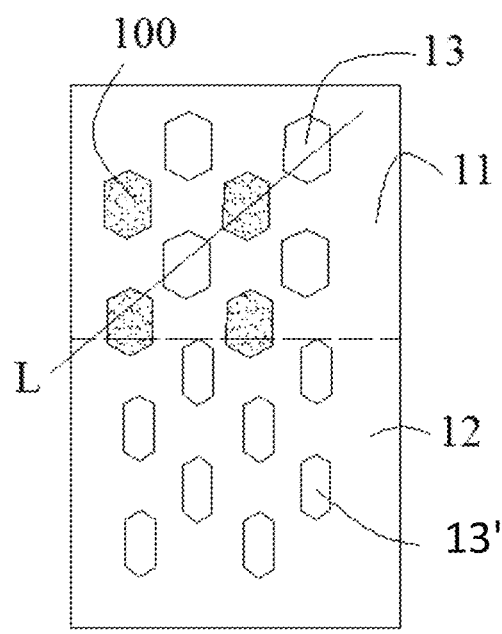
FIG. 2 (a) and FIG. 2 (b) are diagrams each showing a distribution of a dummy low-density opening region of a mask plate according to an embodiment of the present disclosure.
Figure 2:
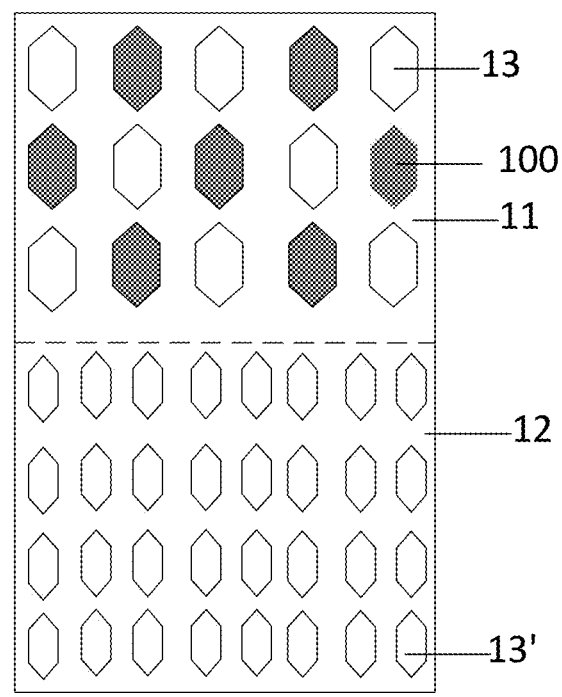
Figure 2:
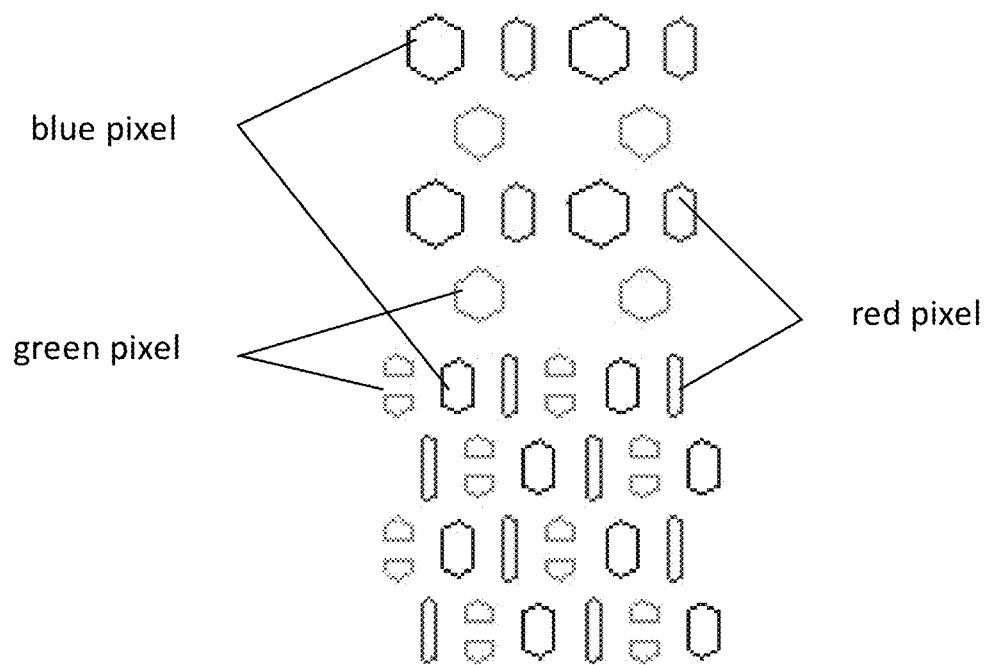
Figure 4:
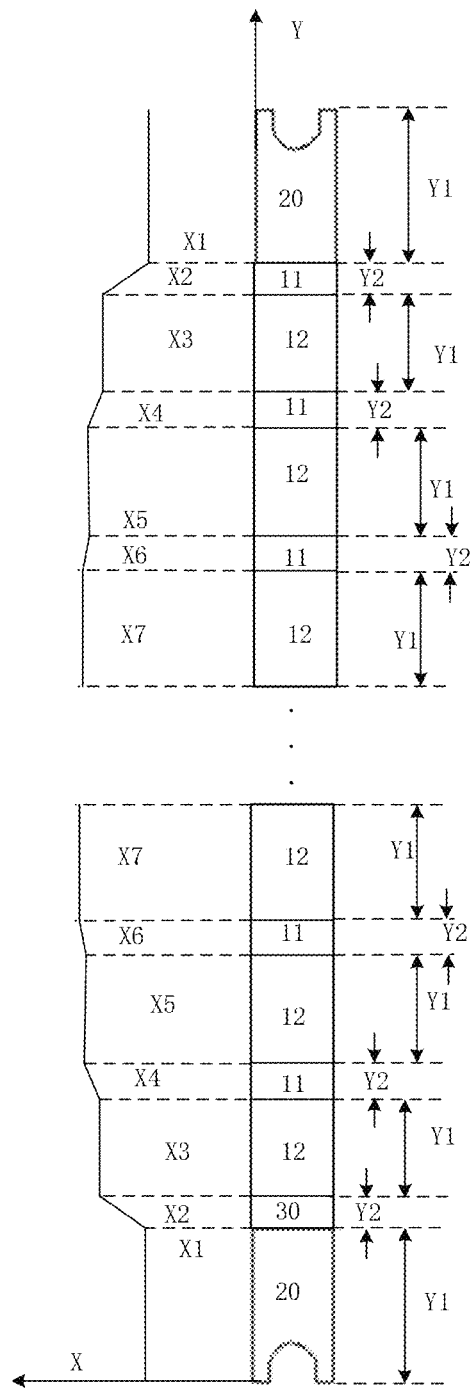
FIG. 4 is a schematic diagram showing dimensions of a mask plate before being stretched according to an embodiment of the present disclosure.

In order to solve at least one of above problems, the present disclosure provides a mask plate, referring to FIG. 2 (a) to FIG. 4, which includes at least one pattern region, each pattern region including a low-density opening region 11 and a high-density opening region 12 which are adjacent to each other in a lengthwise direction of the mask plate, each low-density opening region 11 has a plurality of pattern openings 13 penetrating through the mask plate, and each high-density opening region 12 has a plurality of pattern openings 13' penetrating through the mask plate, a ratio of a sum of areas of the pattern openings 13' in the high-density opening region 12 to a total area of the high-density opening region 12 is greater than a ratio of a sum of areas of the pattern openings 13 in the low-density opening region 11 to a total area of the low-density opening region 11, and compensation grooves 100 not penetrating through the mask plate are further provided at gaps between the pattern openings 13 of the low-density opening region 11.

Note that, in the present disclosure, the "lengthwise direction of the mask plate" refers to a direction in which the mask plate is stretched, and the "widthwise direction of the mask plate" refers to a direction perpendicular to the lengthwise direction of the mask plate described above.

FIG. 2 (a) and FIG. 2 (b) show details of the pattern openings 13 and 13' of one pattern region, and FIG. 4 shows a mask plate having two pattern regions. The low-density opening region 11 and the high-density opening region 12, which are adjacent to each other in the lengthwise direction of the mask plate (an up-down direction in FIG. 2 and FIG. 4), are respectively used to form patterns in a low-resolution display region and patterns in a high-resolution display region in a display substrate (also called as panel). The pattern openings 13 and 13' are configured to allow a film forming material to pass through, so that an outline of the corresponding film forming material can be formed on the display substrate according to the shapes of the pattern openings 13 and 13'.

An area of the pattern opening 13 in the low-density opening region 11 may be larger than or equal to an area of the pattern opening 13' in the high-density opening region 12, for example, for red pixel units and blue pixel units to be formed, the shapes of the pattern openings 13 in the low-density opening region 11 are the same as those of the pattern openings 13' in the high-density opening region 12, for example, each of them is a hexagon, but the area of each of the pattern openings 13 in the low-density opening region 11 is larger than the area of each of the pattern openings 13' in the high-density opening region 12, that is, a dimension of the pattern opening 13 in the low-density opening region 11 is larger than a dimension of the pattern opening 13' in the high-density opening region 12. For green pixel units to be formed, the shapes of the pattern openings 13 in the low-density opening region 11 are different from those of the pattern openings 13' in the high-density opening region 12, for example, each of the pattern openings 13 in the low-density opening region 11 is a hexagon, but the pattern openings 13' in the high-density opening region 12 include two symmetrical pentagons, while the area of each of the pattern openings 13 in the low-density opening region 11 is not smaller than the area of each of the pattern openings 13' in the high-density opening region 12, as shown in FIG. 2 (c). The number of the pattern openings 13 per unit area in the low-density opening region 11 is relative small, that is, the resolution is low, ensuring that there are more transparent regions in the low-density opening region 11. More transparent regions can ensure that more effective detection area is reserved for the camera or the like in the display device such as a mobile phone.

Figure 3:
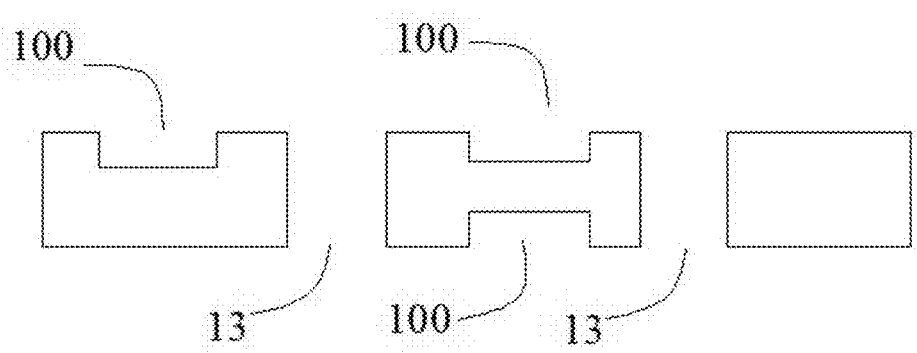
FIG. 3 is a cross-sectional view of the mask plate shown in FIG. 2 taken along line L.

Referring to FIG. 2 and FIG. 3, the present disclosure proposes to provide compensation grooves 100, not penetrating through the mask plate, in the low-density opening region 11. The compensation grooves 100 do not penetrate through the mask plate so that the compensation grooves 100 can still block the film forming material. Due to an introduction of the compensation grooves 100, a mechanical strength of the low-density opening region 11 and a mechanical strength of the high-density opening region 12 tend to be close to each other, and the expansion-contraction ratio of the pattern openings 13 in the low-density opening region is close to that of the pattern openings 13' in the high-density opening region when the mask plate is stretched, so that the difficulty of accurately controlling the shapes and the positions of the pattern openings 13 and 13' when the mask plate is stretched is reduced.

In some implementations, the pattern openings 13 in the low-density opening region 11 have a lengthwise direction, the compensation grooves 100 have a lengthwise direction, and the shapes and the lengthwise direction of the compensation grooves 100 are the same as those of the pattern openings 13 in the low-density opening region 11.

Referring to FIG. 2, the lengthwise direction of the compensation grooves 100 is an up-down direction, which is the same as the lengthwise direction of the pattern openings 13 in the low-density opening region 11.

Certainly, if the lengthwise direction of the pattern openings 13 is polar, an "orientation" of the lengthwise direction of the compensation grooves 100 should be the same as an "orientation" of the lengthwise direction of the pattern openings 13 in the low-density opening region 11.

In this way, a distribution of shapes of mechanical structures in the low-density opening region 11 is more uniform, thereby facilitating controlling the shapes of the patterns therein when the mask plate is stretched.

In some implementations, referring to FIG. 2, a center of each of at least a portion of the compensation grooves 100 is disposed at a center of a pattern formed by centers of multiple ones of the pattern openings 13 adjacent to said each of at least a portion of the compensation grooves 100.

That is, each compensation groove 100 is located at a centroid of a structure surrounding it, in this way, the distribution of the shapes of the mechanical structures in the low-density opening region 11 is more uniform, thereby facilitating controlling the shapes of the patterns therein when the mask plate is stretched.

In some implementations, referring to FIG. 2, the pattern openings 13 in the low-density opening region 11 are arranged in rows and columns, and at least a portion of the compensation grooves 100 are disposed between adjacent rows of the pattern openings 13 in the low-density opening region 11 and between adjacent columns of the pattern openings 13 in the low-density opening region 11.

In such way, the distribution of the shapes of the mechanical structures in the low-density opening region 11 is more uniform, thereby facilitating controlling the shapes of the patterns therein when the mask plate is stretched.

In some implementations, the mask plate is used to block a portion of the film forming material from transferring to the display substrate during forming a film on the display substrate.

Specifically, for example, in the evaporation process, the region of the mask plate other than the pattern openings 13 blocks the film forming material from contacting the display substrate.

Specifically, referring to FIG. 3, a lower surface of the mask plate in FIG. 3 is set to face the display substrate. The compensation grooves 100 may be provided on an upper surface, or both upper and lower surfaces, of the mask plate. Certainly, the compensation grooves 100 may be disposed on the lower surface of the mask plate. As long as these compensation grooves 100 do not penetrate through the mask plate, they can still function to block the film forming material from contacting the display substrate.

In some implementations, the mask plate is in an original state when not subjected to an external force along the lengthwise direction of the mask plate, and the mask plate is in a flat state when being stretched and flattened by the external force along the lengthwise direction of the mask plate; at any position of the mask plate in the lengthwise direction, a ratio of the dimension of the mask plate in the original state along any direction to the dimension of the mask plate in the flat state along the direction is the expansion-contraction ratio of the position in the direction; except at the boundary between the low-density opening region and the high-density opening region, expansion-contraction ratios of the low-density opening region in the lengthwise direction and the widthwise direction of the mask plate at any position are respectively different from expansion-contraction ratios of the high-density opening region in the lengthwise direction and the widthwise direction of the mask plate at any position.

Dimensions of the mask plate after being completely flattened (i.e., after being stretched) are used as reference standards and are respectively normalized to 1, so that before the mask plate is stretched, normalized values of the dimensions of the patterns in the low-density opening region 11 of the mask plate are different from normalized values of the dimensions of the patterns in the high-density opening region 12 of the mask plate.

For example, a pre-expansion amount of each pattern in the low-density opening region 11 in the widthwise direction of the mask plate is different from a pre-expansion amount of each pattern in the high-density opening region 12 in the widthwise direction of the mask plate; a pre-contraction amount of each pattern in the low-density opening region 11 in the lengthwise direction of the mask plate is also different from a pre-contraction amount of each pattern in the high-density opening region 12 in the lengthwise direction of the mask plate.

It should be noted that, since pre-contractions or pre-expansions of various positions of the mask plate in different directions should be continuous, the pre-contraction amount or the pre-expansion amount at the boundary between the low-density opening region 11 and the high-density opening region 12 is also continuous.

In this way, even if the compensation grooves 100 are provided in the low-density opening region 11 so that a difference in mechanical properties between the low-density opening region 11 and the high-density opening region 12 is reduced, the difference cannot be completely eliminated, and the difference may be compensated by differently setting the pre-contraction amount or the pre-expansion amount of dimensions of various patterns in the low-density opening region 11 and the high-density opening region 12. Therefore, it is further beneficial to accurately control the positions and the shapes of various patterns after the mask plate is stretched.

In some implementations, except at the boundary between the low-density opening region 11 and the high-density opening region 12, the expansion-contraction ratio in the widthwise direction of the mask plate at any position of the low-density opening region 11 is smaller than the expansion to contraction ratio in the widthwise direction of the mask plate at any position of the high-density opening region 12.

That is, in the widthwise direction of the mask plate, the pre-contraction amount of the patterns in the low-density opening region 11 is larger than the pre-contraction amount of the patterns in the high-density opening region 12, because the mechanical strength of the low-density opening region 11 is greater than that of the high-density opening region 12, and the low-density opening region 11 is less likely to be contracted in the widthwise direction of the mask plate when the mask plate is stretched. In order to make an entire width of the low-density opening region 11 is the same as that of the high-density opening region 12 after the mask plate is stretched, the width of the low-density opening region 11 should be smaller than that of the high-density opening region 12 before the mask plate is stretched.

In some implementations, except at the boundary between the low-density opening region 11 and the high-density opening region 12, the expansion-contraction ratio in the lengthwise direction of the mask plate at any position of the low-density opening region 11 is larger than the expansion-contraction ratio in the lengthwise direction of the mask plate at any position of the high-density opening region 12.

Since a tension force applied in the lengthwise direction of the mask plate is the same at every position of the mask plate, the low-density opening region 11 are less likely to be elongated in the lengthwise direction of the mask plate, and thus when the mask plate is not stretched, the low-density opening region 11 should be designed to have slightly less pre-contraction in the lengthwise direction of the mask plate than the high-density opening region 12.

In some implementations, the mask plate further includes a dummy low-density opening region 30 and dummy end regions 20 located at both ends of the mask plate in the lengthwise direction, the dummy low-density opening region 30 is disposed between the dummy end region 20 located away from the low-density opening region 11 and the high-density opening region 12 closest to the dummy end region 20, and the dummy low-density opening region 30 has the same shape as the low-density opening region 11.

Referring to FIG. 4, the purpose of providing the dummy low-density opening region 30 is to make the mask plate longitudinally symmetrical. This symmetrical structure is beneficial to controlling the deformation of the mask plate. Since the low-density opening region 11 is provided with the compensation grooves 100, the dummy low-density opening region 30 should be provided with the compensation grooves 100 in a same manner.

The dummy end regions 20 are mainly in direct contact with a stretching mechanism (not shown). The stretching mechanism pulls the two dummy end regions 20 to flatten the mask plate.

In some implementations, each of an expansion-contraction amount of the dummy low-density opening region 30 in the widthwise direction of the mask plate and the expansion-contraction amount of the low-density opening region 11 adjacent to the other dummy end region 20 away from the dummy low-density opening region 30 in the widthwise direction of the mask plate linearly varies along the lengthwise direction of the mask plate.

Referring to FIG. 4, an X direction in FIG. 4 is the widthwise direction of the mask plate, and a Y direction is the lengthwise direction of the mask plate. FIG. 4 symmetrically shows structures of both end portions of the mask plate, and only a structure shown by an upper half portion of FIG. 4 is taken as an example for explanation. In FIGS. 4, Y1 and Y2 respectively indicate expansion-contraction ratios of corresponding structures in the Y direction, and X1, X2, X3, X4, X5, X6 and X7 respectively indicate expansion-contraction ratios of corresponding structures in the X direction, where X1 indicates the expansion-contraction ratio of the dummy end region 20 in the X direction, and the pre-expansion amounts of the entire pattern in the X direction in the region are the same, which are X1; X3, X5 and X7 indicate the expansion-contraction ratios of the high-density opening regions 12 in the X direction, respectively, and the pre-expansion amounts of the entire pattern in respective high-density opening regions in the X direction are also the same, which are X3, X5 and X7, respectively. As can be seen from FIG. 4, along a direction from a center position of the mask plate to the upper dummy end region 20, the expansion-contraction ratios of the patterns in respective high-density opening regions in the X direction are gradually reduced, and thus the pre-expansion amounts thereof are gradually reduced. X2, X4 and X6 indicate the expansion-contraction ratios of the respective low-density opening regions 11, from the top to the bottom of FIG. 4, in the X direction. As can be seen from FIG. 4, the expansion-contraction ratios of the respective low-density opening regions in the X direction are linearly changed, and the larger distances of the low-density opening regions from the upper dummy end region 20, the smaller the slope of change of the expansion-contraction ratios. The polyline on the left side of the mask plate as shown in FIG. 4 indicates an outline of the "left side" of the mask plate in the current view before the mask plate being stretched, and it can be seen from the figure that the dimensions of the respective low-density opening regions of the mask plate at the respective edge positions in the stretching direction (the dimensions in the X direction, i.e., the dimensions in the widthwise direction) are different, and the dimension of the low-density regions at the respective edge positions are proportional to the expansion-contraction ratios thereof, meanwhile, the dimensions of the respective high-density opening regions of the mask plate at the respective edge positions in the stretching direction are substantially the same.

According to the current view of FIG. 4, each of left and right boundaries of the dummy low-density opening region 30 is an oblique line before the mask plate is stretched; each of left and right boundaries of the low-density opening region 11, that is in the same environment as and adjacent to the dummy low-density opening region 30, is also an oblique line.

Such setting is adopted because the inventor of the present disclosure found that the contractions of the two regions are linearly changed when the inventor studies a displacement cloud pattern of the mask plate during the mask plate being stretched. Certainly, the pre-expansions of these two regions in the widthwise direction are also linearly changed.

In some implementations, as shown in FIG. 5, the mask plate has two pattern regions repeatedly arranged along the lengthwise direction of the mask plate, except the low-density opening region 11 directly adjacent to the upper dummy end region 20, the expansion-contraction ratios of another low-density opening region 11 in the widthwise direction of the mask plate from a first position therein to boundaries between the another low-density opening region 11 and two high-density opening regions 12 adjacent thereto linearly changes, respectively, as shown by the region marked with X3.

That is, in a case where the mask plate has two pattern regions, rather than the pattern region closest to the end portion, the expansion-contraction ratio, in the widthwise direction of the mask plate, of the low-density opening region 11 in another pattern region is linearly changed. In a case where a shape of the mask plate is exactly vertically symmetrical, a center of the low-density opening region 11 of the another pattern region is exactly located in the middle of the mask plate in the lengthwise direction, in a direction from the center to the two ends of the mask plate in the lengthwise direction, the pre-expansion amounts of the mask plate in the widthwise direction are linearly increased, so that a change rule is obtained. Certainly, if the shape of the mask plate is not exactly vertically symmetrical, the first position mentioned above may be offset with respect to the center.

The following is a specific parameter setting of the pre-contraction and the pre-expansion of the mask plate in the lengthwise direction and the widthwise direction. With reference to FIG. 5, $X1=1.00005$, $X2=1.0001$, $X3=1.00007$, $Y1=0.9998$, and $Y2=0.9999$. The selection of above specific values may be varied for various mask plates.

In the present embodiment, the dimensions in the widthwise direction of the high-density region and the low-density region at various positions are set according to the expansion-contraction ratios at these positions, and after the mask plate is stretched, the mask plate becomes flat, and each of the contour lines on the left sides shown in FIG. 4 and FIG. 5 may become a straight line, that is, the dimensions of the mask plate at the positions in the direction in which the mask plate is stretched become the same, so that the shapes and the positions of the pattern openings can be accurately controlled, and the accuracy of the manufactured substrate can be improved.

An embodiment of the present disclosure further provides a manufacturing method of the mask plate described above, as shown in FIG. 6, the manufacturing method includes:

Step 601, forming pattern openings in a mask substrate, a ratio of a sum of areas of pattern openings in a high-density opening region to a total area of the high-density opening region is greater than a ratio of a sum of areas of pattern openings in a low-density opening region to a total area of the low-density opening region; and Step 602, forming grooves not penetrating through the mask plate along a thickness direction of the mask plate at positions between the pattern openings of the low-density opening region.

The mask plate manufactured by the embodiment of the present disclosure can accurately control the shapes and the positions of the pattern openings, thereby improving the precision of the manufactured substrate.

Figure 7:
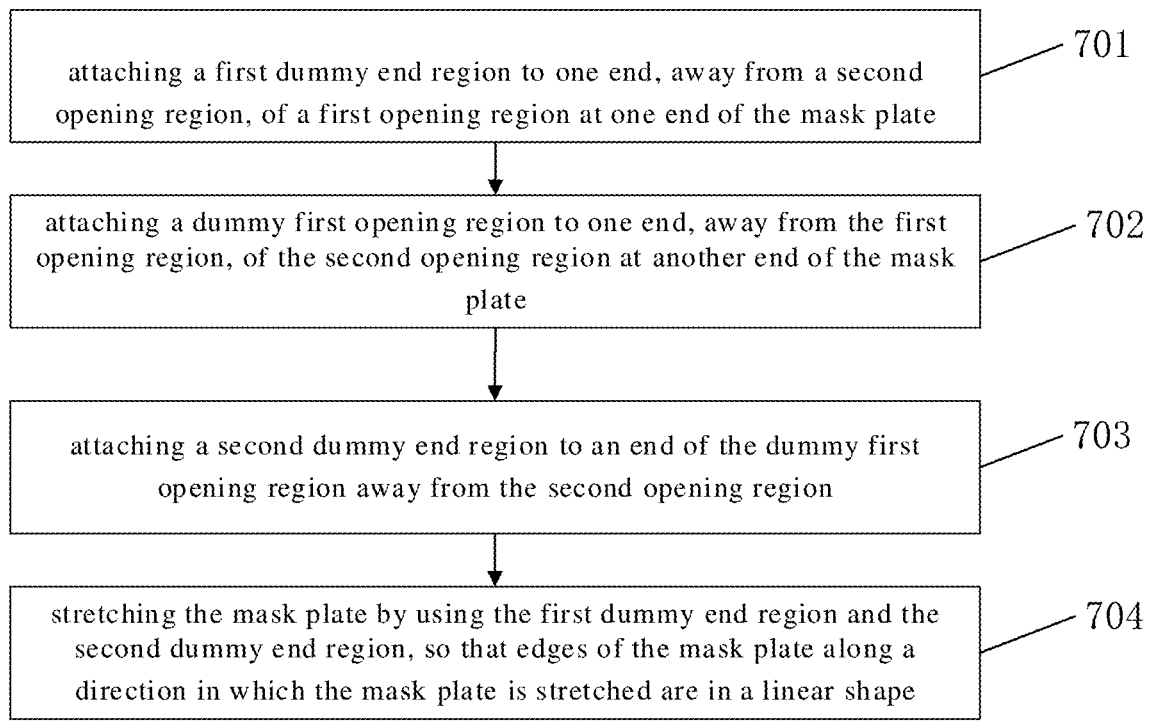
FIG. 7 is a flowchart of a method of using a mask plate according to an embodiment of the present disclosure.

An embodiment of the present disclosure further provides a method for using the mask plate in the above embodiment, as shown in FIG. 7, the method includes:

Step 701, attaching a first dummy end region to an end, away from a second opening region (the high-density opening region), of a first opening region (the low-density opening region) at an end of the mask plate;

Step 702, attaching a dummy first opening region to an end, away from the first opening region, of the second opening region at another end of the mask plate;

Step 703, attaching a second dummy end region to an end of the dummy first opening region away from the second opening region;

Step 704, stretching the mask plate by using the first dummy end region and the second dummy end region, so that edges of the mask plate along a direction in which the mask plate is stretched are in a linear shape, wherein before stretching the mask plate, the dimensions, along a direction perpendicular to the direction in which the mask plate is stretched, of the mask plate at positions along the direction in which the mask plate is stretched are different, and the dimension of the mask plate at any position is proportional to the expansion-contraction ratio of the mask plate at the position along the direction perpendicular to the direction in which the mask plate is stretched.

It should be understood that the above embodiments are merely exemplary embodiments adopted to illustrate the principle of the present disclosure, and the present disclosure is not limited thereto. It will be apparent to those skilled in the art that various modifications and improvements may be made without departing from the spirit and scope of the present disclosure, and such modifications and improvements are considered to be within the scope of the present disclosure.

The invention claimed is:

1. A mask plate, comprising at least one pattern region, each of the at least one pattern region comprises a first opening region and a second opening region adjacent to each other in a lengthwise direction of mask plate, each of the first opening region and the second opening region has a plurality of pattern openings penetrating through the mask plate along a thickness direction of the mask plate, wherein, a ratio of a sum of areas of the pattern openings in the second opening region to a total area of the second opening region is greater than a ratio of a sum of areas of the pattern openings in the first opening region to a total area of the first opening region, and the first opening region has grooves not penetrating through the mask plate in the thickness direction of the mask plate, and wherein except for at a boundary between the first opening region and the second opening region, expansion-contraction ratios at any position of the first opening region in a first direction and a second direction of the mask plate are respectively different from expansion-contraction ratios at any position of the second opening region in the first direction and the second direction of the mask plate, wherein the first direction is a direction along which the first opening region and the second opening region are arranged, and the second direction is a direction orthogonal to the first direction.

2. The mask plate according to claim 1, wherein a shape and a dimension of each of the grooves are respectively the same as a shape and a dimension of each of the pattern openings in the first opening region.

3. The mask according to claim 1, wherein a center of each of at least a portion of the grooves is located at a center of a pattern constituted by centers of multiple ones of the pattern openings adjacent to said each of at least a portion of the grooves.

4. The mask plate according to claim 1, wherein the pattern openings in the first opening region are arranged in rows and columns, and at least a portion of the grooves are located between adjacent rows of the pattern openings in the first opening region and between adjacent columns of the pattern openings in the first opening region.

5. The mask plate according to claim 1, wherein the grooves are located on an upper surface and/or a lower surface of the mask plate.

6. The mask plate according to claim 1, wherein
except the boundary between the first opening region and the second opening region, the expansion-contraction ratio at any position of the first opening region in the second direction of the mask plate is less than the expansion-contraction ratio at any position of the second opening region in the second direction of the mask plate.

7. The mask plate according to claim 6, wherein
except the boundary between the first opening region and the second opening region, the expansion-contraction ratio at any position of the first opening region in the first direction of the mask plate is larger than the expansion-contraction ratio at any position of the second opening region in the first direction of the mask plate.

8. The mask plate according to claim 7, further comprising a dummy first opening region, and a first dummy end region and a second dummy end region located at both ends of the mask plate in the first direction, the dummy first opening region is located between the second dummy end region away from the first opening region and the second opening region closest to the second dummy end region, and a shape of the dummy first opening region is the same as that of the first opening region.

9. The mask plate according to claim 8, wherein the mask plate has a plurality of the pattern regions repeatedly arranged in a first direction of the mask plate, the mask plate being symmetrically arranged with respect to a center line, in a second direction, of the first opening region at a central position of the mask plate, in the first opening region at the central position, in a direction from the center line to the first dummy end region, dimensions in the second direction at edge positions linearly increase, and in a direction from the center line to the second dummy end region, dimensions in the second direction at edge positions linearly increase;

in a direction from the first opening region at the central position to the first dummy end region, dimensions in the second direction at edge positions within each first opening region except the first opening region at the central position linearly decreases; and in a direction from the first opening region at the central position to the second dummy end region, dimensions in the second direction at edge positions within each first opening region except the first opening region at the central position linearly decreases.

10. The mask plate according to claim 9, wherein in each second opening region, dimensions in the second direction at edge positions are the same;

in the direction from the first opening region at the central position to the first dummy end region, dimensions of the second opening regions in the second direction successively decrease;

in the direction from the first opening region at the central position to the second dummy end region, dimensions of the second opening regions in the second direction successively decrease.

11. The mask plate according to claim 8, wherein each of expansion-contraction ratios of the dummy first opening region and the first opening region adjacent to the second dummy end region in the second direction of the mask plate is linearly changed in the first direction of the mask plate.

12. The mask plate according to claim 11, wherein the mask plate has two pattern regions repeatedly arranged along the first direction of the mask plate, and except the first opening region adjacent to the second dummy end region, the expansion-contraction ratios of another first opening region in the second direction of the mask plate from a first position in the another first opening region to boundaries of two second opening regions adjacent thereto are linearly changed respectively.

13. The mask plate according to claim 1, wherein the area of each of the pattern openings in the first opening region is different from that of each of the pattern openings in the second opening region.

* * * * *